US007636016B2

(12) United States Patent
Russell et al.

(10) Patent No.: US 7,636,016 B2
(45) Date of Patent: Dec. 22, 2009

(54) CURRENT MIRROR CIRCUIT

(75) Inventors: Howard T. Russell, Fort Worth, TX (US); Ronald L. Carter, Arlington, TX (US); Wendell A. Davis, Arlington, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 0 days.

(21) Appl. No.: 11/856,677

(22) Filed: Sep. 17, 2007

(65) Prior Publication Data

US 2009/0072909 A1 Mar. 19, 2009

(51) Int. Cl.
*H03F 3/04* (2006.01)

(52) U.S. Cl. ....................................... 330/288; 323/315

(58) Field of Classification Search ................. 330/288; 323/315, 316

See application file for complete search history.

(56) References Cited

U.S. PATENT DOCUMENTS 3,588,672 A 6/1971 Wilson
4,739,246 A * 4/1988 Thomson .................... 323/273
5,812,029 A * 9/1998 Prentice ...................... 330/278
6,680,651 B2 * 1/2004 Kim ........................... 330/288
6,816,014 B2 * 11/2004 Whitney et al. ............. 330/288
6,867,652 B1 * 3/2005 Hastings et al. ............. 330/298
7,312,651 B2 * 12/2007 Kudo ......................... 327/540
7,365,601 B2 * 4/2008 Draxelmayr ................ 330/288

OTHER PUBLICATIONS

Matsumoto, Fujihiko, et al., "A high-precision low-voltage bipolar current mirror circuit and its compenation for stability," International Journal of Electronics, 2000, V. 87, Issue 1, pp. 71-78.

* cited by examiner

*Primary Examiner*—Henry K Choe
(74) *Attorney, Agent, or Firm*—Chowdhury & Georgakis, P.C.

(57) ABSTRACT

An all-NPN bipolar junction current mirror circuit for mirroring an input reference current is disclosed. The circuit includes an input stage for providing an input reference current to the current mirror circuit, a reference stage for mirroring the input reference current and an output stage electrically connected to the reference stage for providing the mirrored input current to at least one load.

12 Claims, 3 Drawing Sheets

CURRENT MIRROR CIRCUIT

BACKGROUND

The present invention relates generally to electrical circuits and, more particularly, to an all-NPN bipolar junction transistor current mirror circuit for precisely mirroring an input reference current. A current mirror circuit is designed to replicate a known reference current in one branch of a circuit and apply the replicated reference current into another branch of the circuit. Ideally, the known reference current would be the same as the replicated reference current regardless of the number of loads added to the current mirror circuit.

Despite being constructed of relatively old technology, current mirrors are used in a wide variety of industry applications. For example, current mirrors are used in precision DC biasing circuits, precision gain control circuits, integrated circuits, active loads, precise reference current generation in digital-to-analog converters (DACs) and analog-to-digital converters (ADCs), signal paths in current steering circuits, precision charge pumps, and current followers.

While effective at mirroring currents, current mirror circuits are not without their problems. For example, current mirror circuits are subject to the Early effect. The Early effect causes an appreciable difference between the input and output currents resulting from a difference in the input and output voltages.

Additionally, prior art current mirror circuits suffer from a low common-emitter amplification factor, also known as beta error. As with the Early effect, beta error causes a difference between the input and output currents resulting from the common-emitter amplification factor dropping below an operational value.

There are a number of current mirror circuits well-known in the art which attempt to solve the problems described above. However, actual implementations of these prior art current mirror circuits produce less than ideal results. Specifically, the output current produced by prior art circuits still fail to match the input reference current as precisely as desired.

SUMMARY

A current mirror circuit for replicating an input reference current, and outputting the mirrored reference current to at least one load is disclosed. The current mirror circuit includes an input stage for providing an input reference current, a reference stage for mirroring the input reference current received from the input stage and an output stage electrically coupled to the reference stage for outputting the mirrored input reference current to at least one load.

The current mirror circuit disclosed herein includes a common-base transistor in a feedback loop to compensate for the loss of base current and a pair of emitter-follower transistors to produce a sufficiently large loop gain which in turn, produces a stable reflection coefficient. Ideally, the collector current in the output stage is a precise copy of the input reference current and is not affected by the change in the load current of the current mirror circuit.

BRIEF DESCRIPTION OF THE DRAWINGS

Embodiments are illustrated by way of example in the accompanying figures, in which like reference numbers indicate similar parts, and in which.

DETAILED DESCRIPTION OF EXEMPLARY EMBODIMENTS

Figure 1:
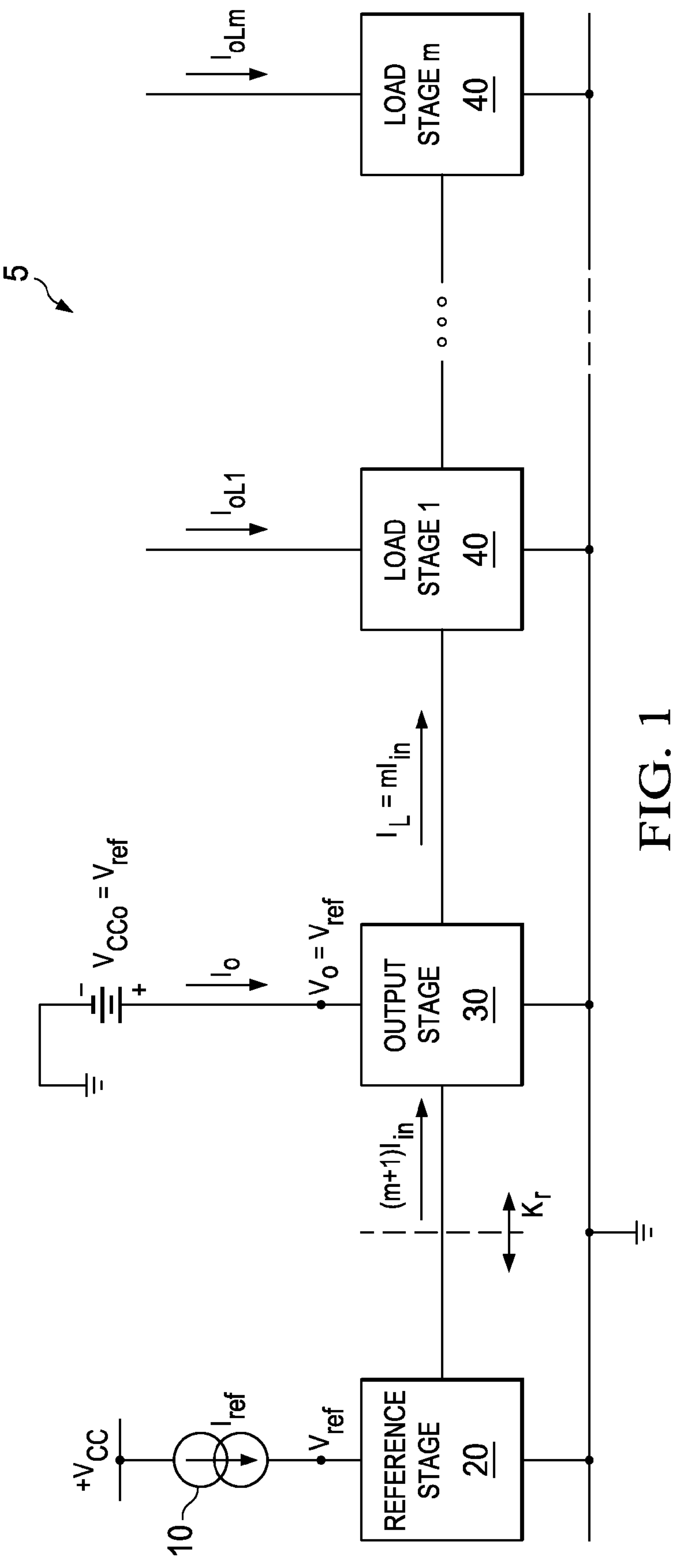
FIG. 1 shows a block diagram of an exemplary embodiment of a current mirror circuit.

Referring now to the figures and in particular, FIG. 1, an exemplary embodiment of an all-NPN bipolar junction transistor current mirror circuit 5 is disclosed.

FIG. 1, illustrating a block diagram of the current mirror circuit 5 includes an input stage 10, a reference stage 20 and an output stage 30. The input stage 10 feeds an input reference current to the current mirror circuit 5. The reference stage 20 operates to mirror the input reference current from the input stage 10 and feed the mirrored current to the output stage 30. The output stage 30 sends the outputted current to the load or loads 40 applied to the current mirror circuit 5 without a reduction in output current.

Figure 2:
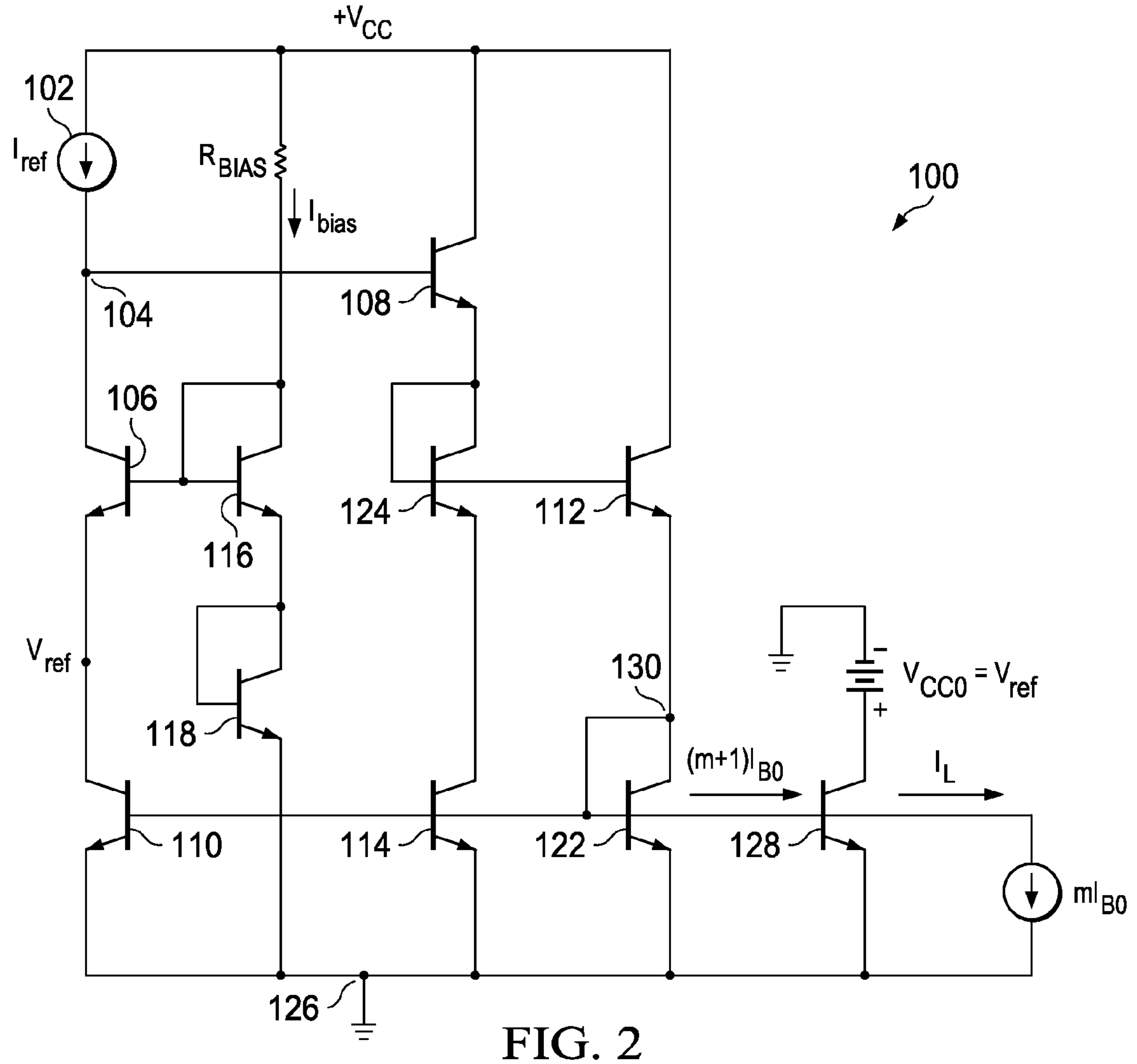
FIG. 2 shows a schematic diagram of an exemplary embodiment of the current mirror circuit of FIG. 1.

FIG. 2 illustrates a schematic diagram of an exemplary embodiment of the current mirror circuit 100. The input stage of the current mirror circuit 100 includes an input current source 102 and is representative of any source of electrical reference current IREF. For example, actual implementations of the current source 102 can include a resistor connected to a voltage source, another current mirror, or other circuitry.

The reference stage of the current mirror circuit 100 is a feedback loop having a feedback path and a forward path and is comprised of transistors 106, 110, 122, 112, and 108. Specifically, transistors 106, 110 and 122 form the feedback path of the feedback loop and transistors 108 and 112 form the forward path of the feedback loop.

To form the feedback path of the feedback loop, transistor 106 has its collector connected to comparison node 104, its base connected to RBIAS, and the base and collector of transistor 116, and has its emitter connected to the collector of transistor 110. Transistor 106 is biased at its base with resistor RBIAS and transistors 116 and 118. The resistor RBIAS is connected between the Vcc node and the collector of transistor 116. Transistor 116 further has its base connected to its collector and to the base of transistor 106 and its emitter connected to the base and collector of transistor 118. The emitter of transistor 118 is connected to the node 126. This bias is fixed and is not determined by the feedback loop (transistors 106-110-122-112-108).

Transistor 110 has its base connected to the base of transistor 114 and the base and collector of transistor 122. The emitter of transistor 110 is connected to node 126. Similarly, the emitters of transistors 114 and 122 are connected to node 126. The collector of transistor 114 is connected to the emitter of diode-connected transistor 124.

The collector of transistor 122 is connected to the base of transistor 122 and the emitter of transistor 112. The collectors of transistors 112 and 108 are connected to the VCC node. The base of transistor 112 is connected to the base and collector of transistor 124 as well as to the emitter of transistor 108. The base of transistor 108 is connected to the node 104 which completes the feedback loop. Transistors 110, 114, and 122 are biased at their respective bases comprised to provide approximately the same collector voltage.

The forward path of the feedback loop is comprised of transistors 108 and 112. The collectors of transistors 108 and 112 are connected together at the VCC node to form the Darlington pair 108-112. A Darlington pair is a semiconductor device which contains two transistors connected in such a way that the current amplified by the first transistor is additionally amplified by the second transistor. The emitter of the transistor 108 is connected to the base and collector of a diode-connected transistor 124, and the base of transistor 108 is connected to 104. The base of transistor 112 is connected to the base and collector of transistor 124 and has its emitter connected to collector of transistor 122.

The output stage of the current mirror circuit 100 is comprised of a single load transistor 128. While shown as a single load, transistor 128 can be any number of loads electrically coupled to the output stage of the current mirror circuit 100.

During operation of the current mirror circuit 100, input reference current IREF flows from the current source 102 to comparison node 104. At the node 104, the reference current IREF is split into base current IB108 and collector current IC106. Base current IB108 flows from the input node 104 to the base of the transistor 108 to bias transistor 108. The collector current IC106 flows from the comparison node 104 to the collector of transistor 106. This action is expressed by the following equation:

$$IREF=IC106+IB108 \quad (1)$$

The transistor 106 serves two functions. Transistor 106 adds base current IB106 into the current path with IREF. Bias resistor Rbias is adjusted to cause the base current IB106 to equal the base current IB108. The base current IB106 compensates for the base current IB108 that is subtracted from input reference current IREF at node 104 so that the collector current IC110 provided to the collector of transistor 110 is close to the same value as that of the input reference current IREF. Simply, the collector current IC110 is trimmed by RBIAS to match the input reference current IREF. This base current compensation is expressed by the following equations:

$$IC110=IE106=IC106+IB106 \quad (2)$$

$$IC110=IREF-IB108+IB106 \quad (3)$$

Second, the transistor 106 operates as a part of the feedback stage to regulate the size of collector current IC106, and thus, regulates the base current IB108. If the base current IB108 becomes too large, transistor 108 will become saturated resulting in a zero current flow. If the current flow reaches zero, the current mirror circuit will cease to function.

As the base current IB108 flows through the base of transistor 108, it is amplified by transistor 108 and is amplified a second time by transistor 112. At this point, base current IB108 becomes emitter current IE112.

With transistors 108 and 112 electrically connected to diode-connected transistors 122 and 124 in their emitters, the collector-base junctions of 110, 114, and 122 are biased at zero volts so that they are operating on the edge of saturation. Furthermore, with equal forward-biased base-emitter junction voltages of these transistors 110, 114 and 122 including those of the output and load transistors, the collector currents of all devices on the bias chain are forced to be nearly equal. In other words, IC110, IC114, IC112, ICO and IL will be approximately equal to IREF. With IREF set to a constant value and with VCCO equal to the reference voltage VREF to eliminate the Early effect, the collector current ICO of the output transistor 128 from theory is expressed analytically as:

$$I_{Co} = k_r I_{ref} + I_{offset} = \left[1 + \frac{1}{(\beta+1)^2} + \frac{m+3}{\beta(\beta+1)^2}\right]^{-1} I_{ref} \quad (4)$$

where kr is the mirror reflection coefficient and Ioffset is the offset current which is zero for this circuit. The effect of m on ICo is significantly reduced due to transistor betas which have values of 100 or more for typical integrated NPNs.

The emitter current IE112 flows into the feedback path of the feedback loop through collector and base of transistor 122 and is sampled at sampling node 130. A portion of the sampled emitter current IE112 is fed to the output stage of the current mirror circuit 100, and becomes output current (m+1) IBO.

The remaining portion of the sampled emitter current IE112 is fed into the feedback path of the feedback stage. This feedback current flows through the feedback path and is compared with the collector current IC106 at comparison node 104.

Figure 3:
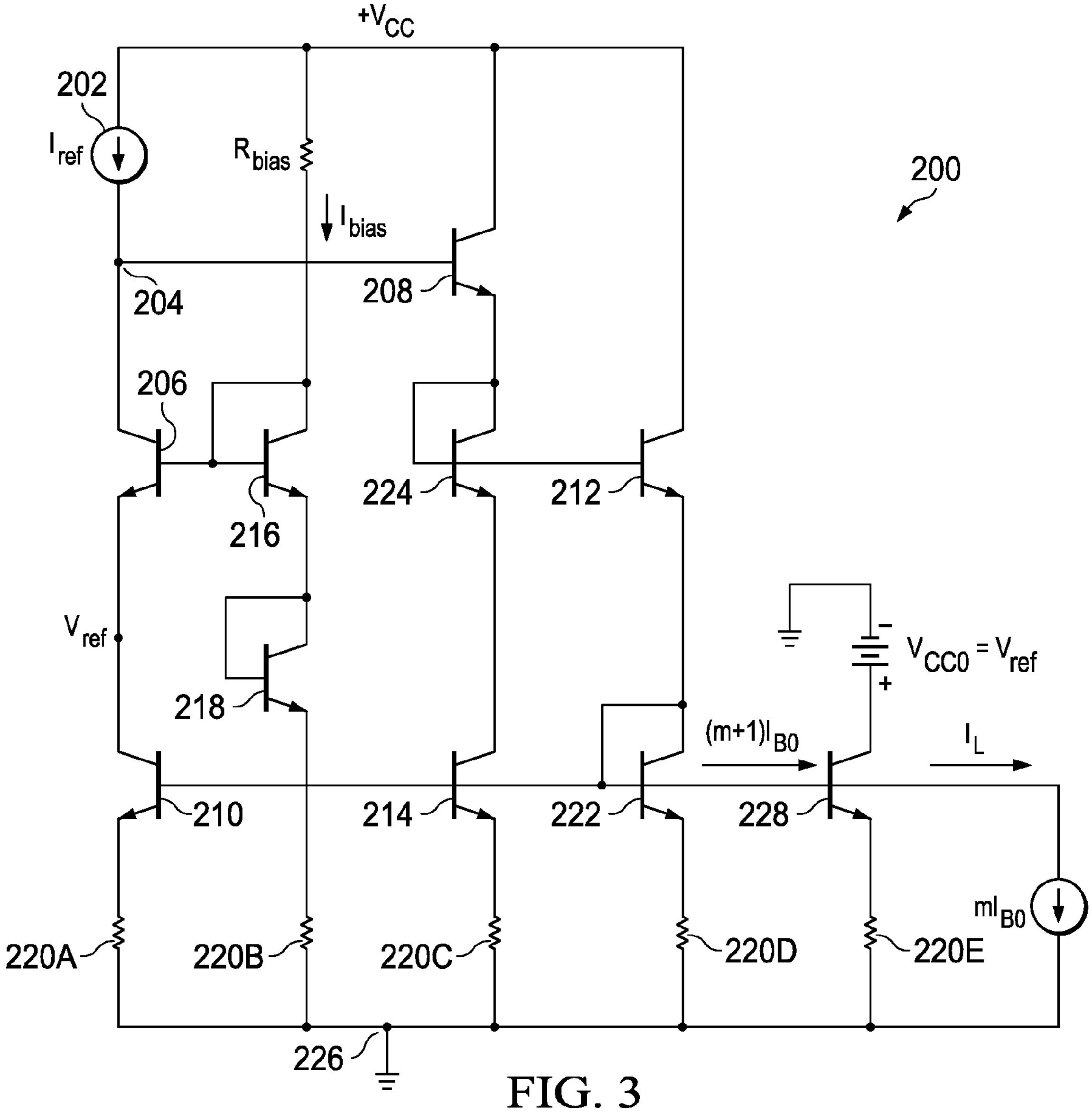
FIG. 3 shows a schematic diagram of another exemplary embodiment of a current mirror circuit.

Referring now to FIG. 3, a schematic diagram of another exemplary embodiment of a current mirror circuit 200 is disclosed. The input stage of the current mirror circuit 200 includes an input current source 202 and is representative of any source of electrical reference current IREF.

The reference stage of the current mirror circuit 200 is a feedback loop having a feedback path and a forward path and is comprised of transistors 206, 210, 222, 212, and 208. Specifically, transistors 206, 210 and 222 form the feedback path of the feedback loop with transistors 208 and 212 forming the forward path of the feedback loop.

To form the feedback path of the feedback loop, transistor 206 has its collector connected to comparison node 204, its base connected to RBIAS, and the base and collector of transistor 216, and has its emitter connected to the collector of transistor 210. Transistor 206 is biased at its base with resistor RBIAS and transistors 216 and 218. The resistor RBIAS is connected between the Vcc node and the collector of transistor 216. Transistor 116 further has its base connected to its collector and to the base of transistor 206 and its emitter connected to the base and collector of transistor 218. The emitter of transistor 118 is connected to the node 226.

Transistor 210 has its base connected to the base of transistor 214 and the base and collector of transistor 122. The emitter of transistor 210 is connected to node 226. Similarly, the emitters of transistors 114 and 122 are connected to node 126. The collector of transistor 214 is connected to the emitter of diode-connected transistor 224.

The collector of transistor 222 is connected to the base of transistor 222 and the emitter of transistor 212. The collectors of transistors 212 and 208 are connected to the VCC node. The base of transistor 212 is connected to the base and collector of transistor 224 as well as to the emitter of transistor 208. The base of transistor 108 is connected to the node 204 which completes the feedback loop. Transistors 210, 214, and 222 are biased at their respective bases comprised to provide approximately the same collector voltage.

The forward path of the feedback loop is comprised of transistors 208 and 212. The collectors of transistors 208 and 212 are connected together at VCC node to form the Darlington pair 208-212. The emitter of the transistor 208 is connected to the base and collector of a diode-connected transistor 224, and the base of transistor 208 is connected to 204. The base of transistor 212 is connected to the base and collector of transistor 224 and has its emitter connected to collector of transistor 222.

The output stage of the current mirror circuit 200 is comprised of a single load transistor 228. Alternatively, transistor 228 can be any number of loads electrically coupled to the output stage of the current mirror circuit 100.

In this embodiment, resistors have been added between the emitters of transistors 210, 218, 222 and 228 and the ground node. These resistors, represented in FIG. 3 with reference numerals 220A, 220B, 220C, 220D, and 20E are included in the current mirror circuit 200 to improve the matching of the current flowing through transistors 210, 214 and 222. The improved matching further reduces the Early effect and aids the current mirror circuit 200 in producing a output current that more precisely mirrors the input reference current.

While various embodiments in accordance with the principles disclosed herein have been described above, it should be understood that they have been presented by way of example only, and are not limiting. Thus, the breadth and scope of the invention(s) should not be limited by any of the above-described exemplary embodiments, but should be defined only in accordance with the claims and their equivalents issuing from this disclosure. Furthermore, the above advantages and features are provided in described embodiments, but shall not limit the application of such issued claims to processes and structures accomplishing any or all of the above advantages.

What is claimed is:

1. A current mirror circuit for driving at least one load, comprising:

an input stage;

a reference stage for mirroring an input reference current, wherein the reference stage includes a feedback stage having first and second paths, wherein the reference stage further includes a bias resistor, the bias resistor being adjusted to cause a base current provided to the first path to balance a current flowing through the second path; and an output stage for feeding the mirrored input reference current to the at least one load, wherein each transistor included in the input stage, the reference stage, and the output stage is a NPN bipolar junction transistor.

2. The current mirror circuit of claim 1, wherein the first path of feedback stage is a feedback path, the feedback path carrying a feedback current to regulate a current flowing through the at least one load.

3. The current mirror circuit of claim 1, wherein the second path of feedback stage is a forward path, the forward path providing amplification to a current flowing therein, the amplified current generating the mirrored input reference current and a feedback current flowing through the first path.

4. The current mirror circuit of claim 2, wherein the feedback path of the feedback stage includes first, second and third electrically coupled transistors for providing the feedback current to a comparison node for comparing the feedback current and the input reference current.

5. The current mirror circuit of claim 4, wherein the first transistor of the feedback path of the feedback stage has a commonly coupled base to compensate for the loss of feedback current.

6. The current mirror circuit of claim 3, wherein the forward path of the feedback stage includes fourth and fifth electrically coupled transistors for amplifying a base current.

7. The current mirror circuit of claim 6, wherein the forward path of the feedback stage includes at least one pair of emitter follower connected transistors connected in a Darlington Pair arrangement.

8. The current mirror circuit of claim 1, wherein the feedback stage further includes a means for comparing the input reference current with the feedback current.

9. The current mirror circuit of claim 1, wherein the feedback stage further includes a means for sampling the amplified base current.

10. The current mirror circuit of claim 1, wherein the output stage is a single load transistor.

11. The current mirror circuit of claim 1, wherein the output stage is a current mirror circuit.

12. The current mirror circuit of claim 1, wherein the output stage is comprised of a plurality of loads.

* * * * *